(12) United States Patent
Koelmel et al.

(10) Patent No.: US 8,461,022 B2
(45) Date of Patent: Jun. 11, 2013

(54) METHODS AND APPARATUS FOR ALIGNING A SUBSTRATE IN A PROCESS CHAMBER

(75) Inventors: Blake R. Koelmel, Mountain View, CA (US); Bruce E. Adams, Portland, OR (US); Theodore P. Moffitt, Hillsboro, OR (US)

(73) Assignee: Applied Materials, Inc., Santa Clara, CA (US)

( * ) Notice: Subject to any disclaimer, the term of this patent is extended or adjusted under 35 U.S.C. 154(b) by 390 days.

(21) Appl. No.: 12/763,400

(22) Filed: Apr. 20, 2010

(65) Prior Publication Data

US 2010/0264132 A1    Oct. 21, 2010

Related U.S. Application Data

(60) Provisional application No. 61/170,926, filed on Apr. 20, 2009.

(51) Int. Cl.
*H01L 21/00* (2006.01)

(52) U.S. Cl.
USPC .................. 438/463; 438/16; 438/18

(58) Field of Classification Search
USPC .......................... 219/647; 438/463
See application file for complete search history.

(56) References Cited

U.S. PATENT DOCUMENTS

| 5,563,798 | A | * | 10/1996 | Berken et al. ............... 700/218 |
| 6,121,581 | A | * | 9/2000 | Hegedus ..................... 219/390 |
| 6,788,991 | B2 | | 9/2004 | De Haas et al. |
| 7,004,716 | B2 | | 2/2006 | Graf et al. |
| 2003/0155080 | A1 | * | 8/2003 | Chen et al. ............. 156/345.51 |
| 2008/0276864 | A1 | | 11/2008 | Koelmel et al. |
| 2008/0280453 | A1 | | 11/2008 | Koelmel et al. |

\* cited by examiner

*Primary Examiner* — Ajay K Arora
(74) *Attorney, Agent, or Firm* — Moser Taboada; Alan Taboada

(57) ABSTRACT

Methods and apparatus for aligning a substrate in a process chamber are provided herein. In some embodiments, an apparatus may include a process chamber having an interior volume for processing a substrate therein; and a substrate positioning system configured to determine a substrate position within the interior volume, wherein the substrate positioning system determines the substrate position in two dimensions by the interaction of a first position and a second position along an edge of a substrate with two beams of electromagnetic radiation provided by the substrate positioning system. In some embodiments, a method for aligning a substrate may include placing a substrate in the interior volume of a process chamber; directing electromagnetic radiation into the interior volume in a first beam along a first path and in a second beam along a second path; and determining the position of the substrate in two dimensions by interaction of the first and second beams of electromagnetic radiation with an edge of the substrate proximate a first position and a second position.

20 Claims, 3 Drawing Sheets

METHODS AND APPARATUS FOR ALIGNING A SUBSTRATE IN A PROCESS CHAMBER

CROSS-REFERENCE TO RELATED APPLICATIONS

This application claims benefit of U.S. provisional patent application Ser. No. 61/170,926, filed Apr. 20, 2009, which is herein incorporated by reference in its entirety.

FIELD

Embodiments of the present invention generally relate to semiconductor equipment, and particularly to methods and apparatus for aligning a substrate in a process chamber.

BACKGROUND

In some semiconductor processes, for example, rapid thermal processes (RTP) or other thermal processes, substrate alignment is necessary to facilitate uniform heating of the substrate. For example, substrate alignment includes aligning the substrate with the substrate support, for example, such that the substrate is centered within an edge ring or on a support surface. A well aligned substrate may ensure that the substrate is uniformly heated during a thermal process. For example, a misalignment, such as between the substrate and an edge ring, can result in non-uniform heating of the substrate along an edge thereof.

Typically, a substrate is placed on the substrate support by a transfer robot, or other similar mechanism. For example, the transfer robot may hand the substrate off to lift pins, which then lower the substrate onto the edge ring or support surface. Unfortunately, such placement mechanisms are inaccurate, and misalignment occurs which result in non-uniform heating during thermal processes.

Thus, there is a need in the art for improved methods and apparatus for aligning a substrate in a process chamber.

SUMMARY

Methods and apparatus for aligning a substrate in a process chamber are provided herein. In some embodiments, an apparatus may include a process chamber having an interior volume for processing a substrate therein; and a substrate positioning system configured to determine a substrate position within the interior volume, wherein the substrate positioning system determines the substrate position in two dimensions by the interaction of a first position and a second position along an edge of a substrate with a first beam and a second beam of electromagnetic radiation provided by the substrate positioning system.

In some embodiments, a method for aligning a substrate may include placing a substrate in the interior volume of a process chamber; directing electromagnetic radiation into the interior volume in a first beam along a first path and in a second beam along a second path; and determining the position of the substrate in two dimensions by interaction of the first and second beams of electromagnetic radiation with an edge of the substrate proximate a first position and a second position.

Other and further embodiments are discussed below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The above drawings are not to scale and may be simplified for illustrative purposes.

DETAILED DESCRIPTION

Methods and apparatus for aligning a substrate are provided herein. Accurate determination of the substrate position in two dimensions advantageously facilitates improved alignment of the substrate atop a substrate support. Improved alignment is beneficial for achieving a desired heating profile during a thermal process.

Figure 1:
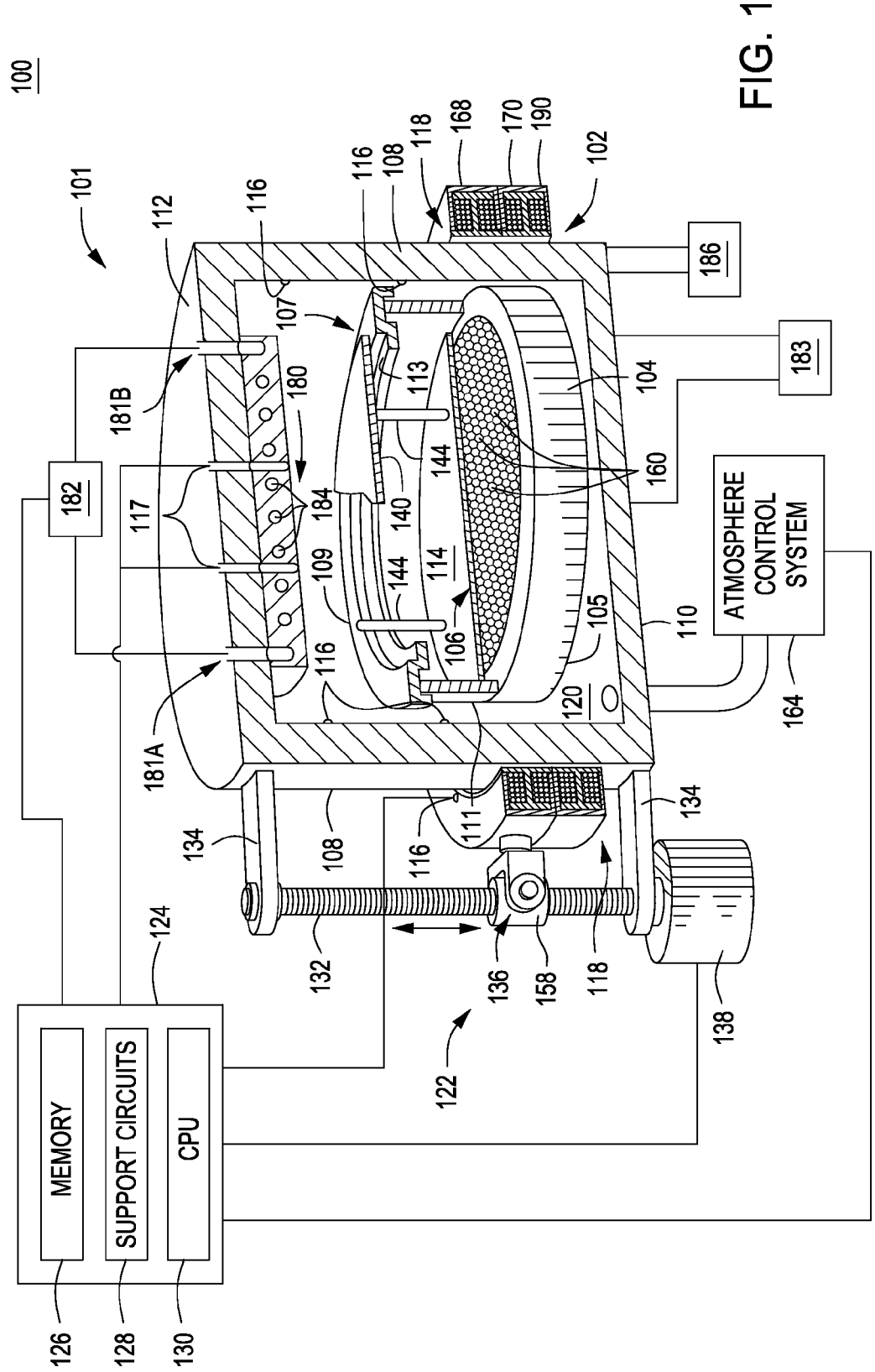
FIG. 1 depicts a semiconductor processing system in accordance with some embodiments of the present invention.

FIG. 1 depicts one exemplary semiconductor processing system which may be utilized in accordance with some embodiments of the present invention. For example, the semiconductor processing system 100 may include a process chamber 101 and a substrate support 104. A substrate 140 is disposed in the process chamber 101 and rests atop a plurality of lift pins 144, where the lift pins 114 are extended such that the substrate 140 is disposed above a support ring 210 of the substrate support 104. The system 100 includes a substrate positioning system configured to determine the position of the substrate 140 within an interior volume 120 of the process chamber 101. Embodiments of a substrate positioning system are depicted in a top cross-section view of the process chamber 101 in FIGS. 2A-B. A substrate positioning system described herein determines the substrate position in two dimensions by the interaction of a first and a second position along an edge of the substrate 140 with electromagnetic radiation provided by the substrate positioning system.

Referring to FIG. 1, the process chamber 101 may be any suitable process chamber, for example, configured for thermal processing, such as a rapid thermal process (RTP). Exemplary RTP chambers that may benefit from the present invention include Radiance®, Quantum X plus and CENTURA® thermal processing systems, available from Applied Materials, Inc., of Santa Clara, Calif. Although the present invention is described as utilized within an RTP chamber (i.e., process chamber 101), embodiments described herein may be utilized in any suitable process chamber where accurate alignment of a substrate on a substrate support is required. Such process chambers may include any process chamber where alignment of a substrate atop a substrate support can affect the temperature profile of the substrate before, during, or after processing.

The processing chamber 101 includes a contactless or magnetically levitated substrate support 104, a chamber body 102, having walls 108, a bottom 110, and a top 112 defining an interior volume 120. The walls 108 typically include at least one substrate access port (not shown) to facilitate entry and egress of a substrate 140 (a portion of which is shown in FIG. 1). The access port may be coupled to a transfer chamber (not shown) or a load lock chamber (not shown) and may be selectively sealed with a valve, such as a slit valve (not shown). The chamber 101 includes an energy source 106 disposed below the substrate 140 and in an inside diameter of the substrate support 104. An exemplary RTP chamber and a substrate support that may be modified in accordance with the present invention are described in U.S. Pat. No. 6,800,833, filed Mar. 29, 2002 and issued on Oct. 5, 2004, U.S. patent application Ser. No. 10/788,979, filed Feb. 27, 2004 and published as U.S. patent Publication No. 2005/0191044 on Sep. 1, 2005, both of which are incorporated by reference in their entireties. However, the substrate support 104 having an energy source 106 disposed therebelow is one exemplary embodiment which may be utilized with the present invention. For example, the present invention may be utilized with an energy source disposed above the substrate support 104, or in other configurations. Further, the present invention may be utilized with non-contactless and/or non-magnetically levitating substrate supports.

The substrate support 104 is adapted to magnetically levitate and rotate within the interior volume 120. The substrate support 104 is capable of rotating while raising and lowering vertically during processing, and may also be raised or lowered without rotation before, during, or after processing. This magnetic levitation and/or magnetic rotation prevents or minimizes particle generation due to the absence or reduction of moving parts typically required to raise/lower and/or rotate the substrate support. In some embodiments, the radiant heat source 106 is movably coupled to the substrate support 104.

The substrate support 104 includes an annular base 105 having an inside diameter sized to receive the radiant heat source 106 and other hardware (not shown in this view). The annular base 105 is at least partially comprised of a magnetic ring section, where the magnetic ring section at least partially comprised of a magnetic material, such as a ferrous containing material, to facilitate magnetic coupling of the substrate support 104 to the stator 118 (discussed in detail below). The ferrous containing material includes low carbon steel, stainless steel, which may include a plating, such as a nickel plating.

A support section 107 is disposed atop the annular base 105 and generally adapted to minimize energy loss, such as heat and/or light, from the radiant heat source 106, such that a substantial portion of energy from the radiant heat source 106 is contained within the region between the lower surface of the substrate 140 and the upper end of the radiant heat source 106. The support section 107 may be an annular extension 111 extending from an upper surface of the annular base 105. The support section 107 may also include a support ring 109 that provides a seating surface 113 for the substrate 140. An example of a support ring 109 that may be used is described in U.S. Pat. No. 6,888,104, filed Feb. 5, 2004, and issued on May 3, 2005, which is incorporated by reference in its entirety. The support section 107 may be fabricated from a material that reduces potential scratching, chemical or physical contamination, and/or marring of the substrate, for example, materials such as silicon carbide, stainless steel, aluminum, ceramic, or a high temperature polymer may be used. At least a portion of the support section 107 may be fabricated or coated with a reflective material, or made of or coated with a opaque material to absorb heat similar to a black body, depending on process parameters.

The substrate support 104 includes a window 114 made from a material transparent to heat and light of various wavelengths, which may include light in the infra-red (IR) spectrum, through which photons from the radiant heat source 106 may heat the substrate 140. In one embodiment, the window 114 is made of a quartz material, although other materials that are transparent to light may be used, such as sapphire.

The plurality of lift pins 144 disposed through the window 114. The lift pins 144 are adapted to selectively contact and support the substrate 140, to facilitate transfer of the substrate into and out of the chamber 100, and further to support the substrate 140 above the support ring 109 during alignment using the substrate positioning system described below in FIGS. 2A-B. Each of the plurality of lift pins 144 are configured to minimize absorption of energy from the radiant heat source 106 and may be made from the same material used for the window 114, such as a quartz material. The plurality of lift pins 144 may be positioned and radially spaced from each other to facilitate passage of an end effector coupled to a transfer robot (not shown). Alternatively, the end effector and/or robot may be capable of horizontal and vertical movement to facilitate transfer of the substrate 140. In some embodiments, the substrate support 104 is capable of horizontal movement, where movement is independent of the plurality of lift pins 144. Accordingly, the substrate support 104 may be moved along a horizontal plane and be aligned relative to the substrate 140 disposed on the lift pins 144.

Figure 2A:
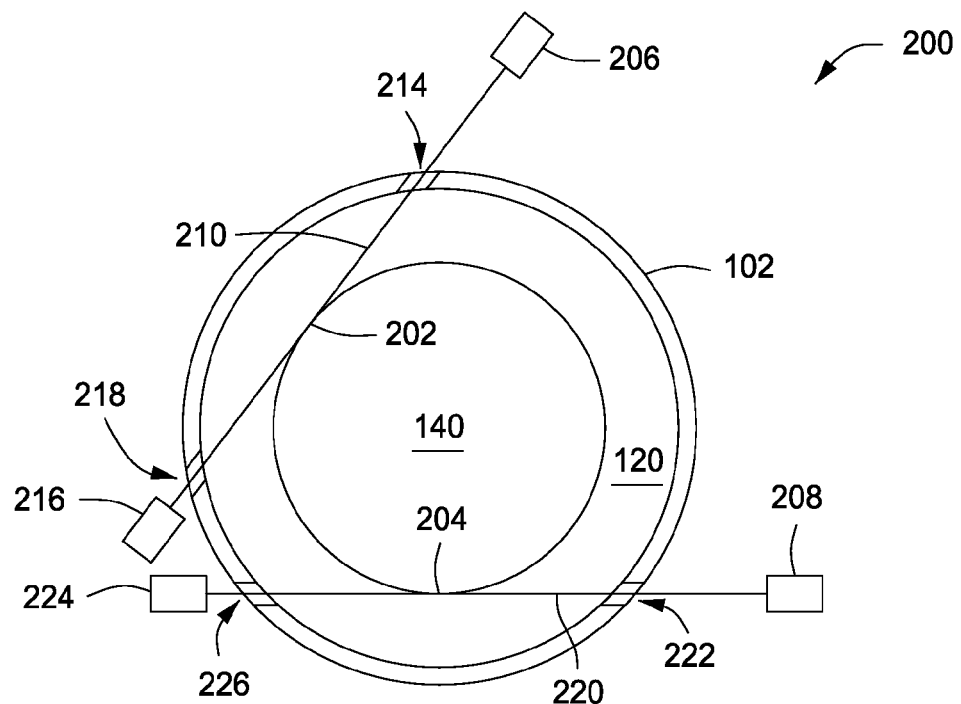
FIGS. 2A-B depict top views of a substrate positioning system in accordance with some embodiments of the present invention.
Figure 2B:
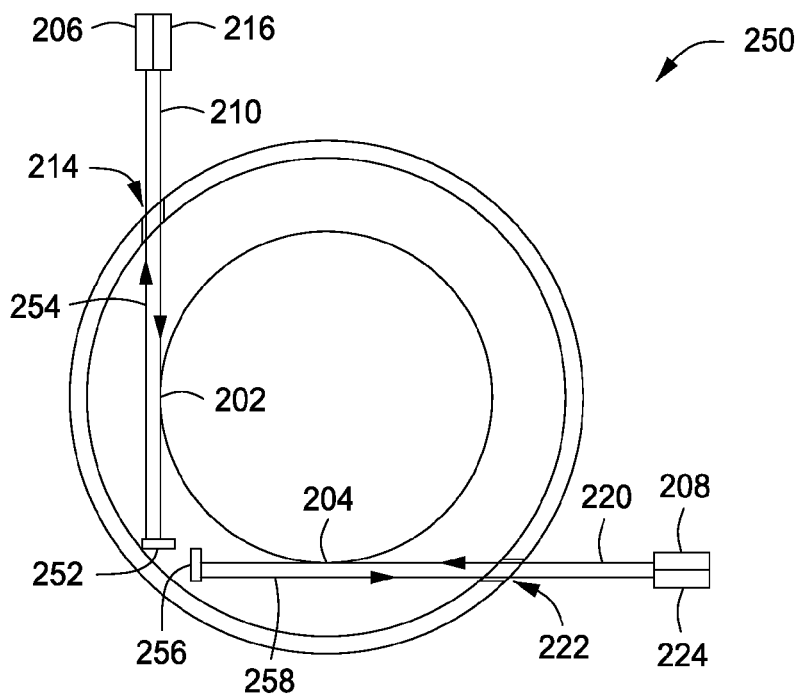

FIGS. 2A-B depict embodiments of a substrate positioning system in accordance with the present invention. The substrate positioning system may be disposed external to the interior volume 120 of the process chamber 101 (FIG. 2A), or having one or more components disposed within the interior volume 120 (FIG. 2B). The substrate positioning system determines the substrate position in two dimensions by the interaction of electromagnetic radiation with a first and a second position 202, 204 along an edge of the substrate 140. The substrate positioning system may provide two separate beams of electromagnetic radiation (e.g., a first beam and a second beam, or a single beam that is split into the first beam and the second beam), each beam interacting with the substrate 140 proximate one of the first and second positions 202, 204 along the edge of the substrate 140.

Generally, the first and second positions 202, 204 may be at any suitable location relative to each other and along the edge of the substrate 140. For example, the first and second positions 202, 204 may be disposed at about 90 degrees (FIG. 2B) from each other with respect to an arc along the substrate edge, or lesser than 90 degrees (FIG. 2A). In addition, in some embodiments, the first and second positions 202, 204 may be disposed at greater than about 90 degrees (not shown) from each other. In some embodiments, the positions along the edge of the substrate 140, such as the first and second positions 202 and 204, may include a distance between the edge of the substrate 140 to about 10 mm inward from the edge of the substrate.

FIG. 2A depicts a substrate positioning system 200 in accordance with some embodiments of the present invention. The substrate positioning system 200 includes a first radiation source 206 and a second radiation source 208. The first and second radiation sources 206, 208 may provide radiation at any suitable wavelength not used or not emitted during a process, such as a thermal process, such as at wavelengths in the visible or near infrared spectrum, or between about 700 to about 1000 nanometers (nm). In some embodiments, the wavelength of radiation provided by the first and second radiation sources is infrared (IR) radiation. In some embodiments, the wavelength of radiation provided by the first and second radiation sources may be within a narrow band, for example, within about 10 nm. In some embodiments, the first and second radiation sources can provide an intelligent signal, such as by pulsing or otherwise placing a signature in the transmitted energy, that facilitates enabling the sensor to pick the signal from the radiation source out of any noise that may be present. Further, the radiation sources 206, 208 each provide a beam of radiation directed towards an edge of the substrate 140. In some embodiments, the width of the beam is about 10 mm. One non-limiting exemplary radiation source that may be utilized with the present invention is a wide area, through beam laser sensor, such as the LV-H100, available from Keyence Corporation.

The first radiation source 206 is disposed exterior to the chamber body 102 of the process chamber 101. The first radiation source 206 is configured to provide electromagnetic radiation along a first path 210, wherein the first path 210 is configured to at least partially intersect the edge of the substrate 140 proximate the first position 202. Electromagnetic radiation provided by the first radiation source 206 enters the interior volume 120 via a window 214 dispose in the chamber body 102. The first path 210 (e.g., a beam of electromagnetic radiation) may have a width of about 10 mm. The first position 202 along the edge of the substrate 140 may interact with the electromagnetic radiation along the first path 210 (for example, the edge of the substrate 140 at the first position 202 may partially or completely block the first path 210), as discussed further below with respect to a method 400.

The substrate processing system 200 further includes a first sensor 216 configured to detect radiation provided by the first radiation source 206. A sensor may include any suitable sensor for detecting electromagnetic radiation at a wavelength discussed above. In some embodiments, the sensor is configured to detect a single wavelength, or a narrow band of wavelengths, such as a band of up to about 10 nm (e.g., a desired wavelength plus or minus about 5 nm). One non-limiting exemplary sensor may be a wide area, through beam laser sensor, such as the LV-H100, available from Keyence Corporation. Thus, the first sensor may advantageously not be a charge coupled device (CCD), which typically senses a much larger band of wavelengths, such as 400-900 nm, and which is expensive. The first sensor 216 is disposed external to the chamber body 102 of the process chamber 101. In some embodiments, the first sensor 216 is disposed at a terminal end of the first path 210 as illustrated in FIG. 2A. Accordingly, the electromagnetic radiation along the first path 210 exits the interior volume 120 via a window 218 disposed in the chamber body 102. The window 218 may be disposed proximate the terminal end of the first path 210.

The second radiation source 208 may be disposed exterior to the chamber body 102 of the process chamber 101. The second radiation source 208 is configured to provide electromagnetic radiation along a second path 220, wherein the second path 220 is configured to intersect the second position 204 along the edge of the substrate 140. Electromagnetic radiation provided by the second radiation source 208 enters the interior volume 120 via a window 222 dispose in the chamber body 102. The second path 220 (e.g., a beam of electromagnetic radiation) may have a width of about 10 mm. The second position 204 along the edge of the substrate 140 interacts with electromagnetic radiation along the second path 220 in the same manner as the first position 202, as discussed further below with respect to a method 400.

The substrate positioning system 200 further includes a second sensor 224 configured to detect radiation provided by the second radiation source 208. The second sensor 224 may be the same type of sensor as the first sensor 216. The second sensor 224 is disposed external to the chamber body 102 of the process chamber 101. In some embodiments, the second sensor 224 is disposed at a terminal end of the second path 220 as illustrated in FIG. 2A. Accordingly, the electromagnetic radiation along the second path 220 exits the interior volume 120 via a window 226 disposed in the chamber body 102. The window 226 may be disposed proximate the terminal end of the second path 220.

An alternative substrate positioning system is depicted in accordance with some embodiments of the present invention in FIG. 2B. A substrate positioning system 250 includes the first radiation source 206 and the second radiation source 208. The first radiation source 206 provides electromagnetic radiation along the first path 210, where the first path 210 is configured to intersect the first position 202 along the edge of the substrate 140. Electromagnetic radiation provided by the first radiation source 206 enters the process chamber 101 via the window 214. The second radiation source 208 provides electromagnetic radiation along the second path 220, where the second path 220 is configured to intersect the second position 204 along the edge of the substrate 140. Electromagnetic radiation provided by the second radiation source 208 enters the process chamber 101 via the window 222.

The substrate positioning system 250 further includes the first sensor 216 and the second sensor 224. In some embodiments, the first sensor 216 is disposed external to the interior volume 120 and adjacent to the first radiation source 206 as illustrated in FIG. 2B. The first sensor 216 is configured to detect radiation provided by the first radiation source 206. In some embodiments, the second sensor 224 is disposed external to the interior volume 120 and adjacent to the second radiation source 208 as illustrated in FIG. 2B. The second sensor 224 is configured to detect radiation provided by the second radiation source 208.

The substrate positioning system 250 may include components disposed within the interior volume 120. Such components may include reflectors, for example, comprising polished stainless steel or quartz, and capable of reflecting electromagnetic radiation from the first and second radiation sources 206, 208.

In some embodiments, a first reflector 252 is disposed at the terminal end of the first path 210 as illustrated in FIG. 2B. The first reflector 252 is configured to reflect electromagnetic radiation provided by the first radiation source 206 to the first sensor 216. The reflected electromagnetic radiation travels along a first return path 254. The first return path 254 may be adjacent to, and substantially parallel to, the first path 210. The first return path exits the interior volume 120 at the window 214.

In some embodiments, a second reflector 256 is disposed at the terminal end of the second path 220 as illustrated in FIG. 2B. The second reflector 256 is configured to reflect electromagnetic radiation provided by the second radiation source 208 to the second sensor 224. The reflected electromagnetic radiation travels along a second return path 258. The second return path 258 may be adjacent to, and substantially parallel to, the second path 220. The second return path exits the interior volume 120 at the window 222.

Figure 3:
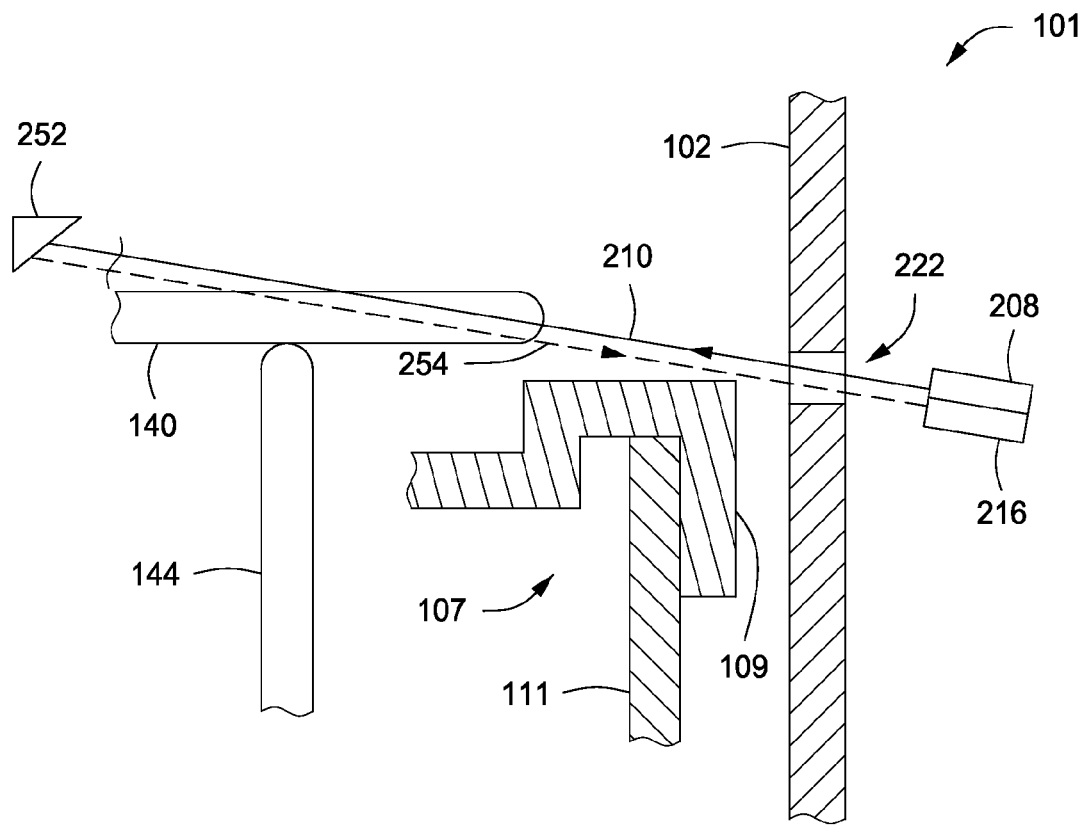
FIG. 3 depicts a substrate positioning system in accordance with some embodiments of the present invention.

In some embodiments, the first and/or second path 210, 220 may be disposed substantially parallel to a substrate surface. In some embodiments, the first and/or second path 210, 220 may be disposed at an angle to a substrate surface. The first and/or second path 210, 220 may be disposed at an angle, for example, to reduce sensitivity due to the thickness of the substrate 140. For example, the substrate 140 may enter the process chamber 101 and be disposed atop the lift pins 144 as depicted in FIG. 3. In an embodiment, where the first path 210 is disposed substantially parallel to the substrate surface (not shown), a height of the substrate 140 may be within about one substrate thickness, or about 750 microns, relative to a vertical position of the first path 210. Otherwise, the first path 210 will fail to intersect at the substrate 140 at the first position along the edge.

In some embodiments, to reduce sensitivity due to substrate thickness, the first path 210 may be disposed at an angle to the substrate surface as depicted in FIG. 3. The angle may be up to about 90 degrees (e.g., perpendicular to the substrate), or in some embodiments, between about −5 degrees to about 5 degrees with respect to the substrate surface. In some embodiments, by providing the first path 210 at an angle to the substrate surface, sensitivity due to substrate thickness is reduced. Further, the angle may be selected and/or the position of components (such as the first radiation source 208, the first sensor and/or the first reflector 252) may be selected such that the first path 210 does not intersect with the substrate support 104, such as across the edge of the support ring 109 as illustrated in FIG. 3.

In some embodiments, the first reflector 252 is a triangular quartz block having a reflective surface on the hypotenuse of the triangular cross-section as illustrated in FIG. 3. In some embodiments, the triangular cross-section includes a 45 degree angle at a vertex of the triangle. Alternatively, the angle of the first reflector 252 may be any suitable angle selected to reflect the beam of electromagnetic radiation from the radiation source to the sensor. Further, the embodiments depicted in FIG. 3 are not limited to the first path 210 of the substrate positioning system 250, and merely illustrated in limited scope for simplicity. The embodiments of FIG. 3, wherein a path of electromagnetic radiation is disposed at an angle to the substrate surface, are applicable to the first and/or second path 210, 220, and either substrate positioning systems 200 or 250.

Further, the angle need not be limited to about −5 to about 5 degrees as discussed above. In some embodiments, the angle may be selected, for example, due to chamber geometry. For example, in a process chamber where components are primarily disposed along the sides of the chamber body, the first and second paths may be oriented at an angle up to about 90 degrees with respect to the substrate surface, such that a substrate positioning system does not interfere with chamber components. Further, to avoid components such as the substrate support 104 in such an embodiment, the first and second paths may be further oriented non-parallel to a central axis of the substrate 140.

Returning to FIG. 1, the energy source 106 includes a lamp assembly formed from a housing which includes a plurality of honeycomb tubes 160 in a coolant assembly (not shown) coupled to a coolant source 183. The coolant source 183 may be one or a combination of water, ethylene glycol, nitrogen ($N_2$), and helium (He). The housing may be made of a copper material or other suitable material having suitable coolant channels formed therein for flow of the coolant from the coolant source 183. Each tube 160 may contain a reflector and a high-intensity lamp assembly or an IR emitter from which is formed a honeycomb-like pipe arrangement. This close-packed hexagonal arrangement of pipes provides energy sources with high-power density and good spatial resolution. In one embodiment, the energy source 106 provides sufficient radiant energy to thermally process the substrate, for example, annealing a silicon layer disposed on the substrate 140. The energy source 106 may further comprise annular zones, wherein the voltage supplied to the plurality of tubes 160 by a controller 124 may varied to enhance the radial distribution of energy from the tubes 160. Dynamic control of the heating of the substrate 140 may be affected by the one or more temperature sensors 117 (described in more detail below) adapted to measure the temperature across the substrate 140. In some embodiments, the radiant energy provided by the energy source 106 has a wavelength between about 700 nm to about 1000 nm.

A stator assembly 118 circumscribes the walls 108 of the chamber body 102 and is coupled to one or more actuator assemblies 122 that control the elevation of the stator assembly 118 along the exterior of the chamber body 102. In one embodiment (not shown), the chamber 100 includes three actuator assemblies 122 disposed radially about the chamber body, for example, at about 120 degree angles about the chamber body 102. The stator assembly 118 is magnetically coupled to the substrate support 104 disposed within the interior volume 120 of the chamber body 102. The substrate support 104 may comprise or include a magnetic portion (e.g., magnetic section 208) to function as a rotor, thus creating a magnetic bearing assembly to lift and/or rotate the substrate support 104. In one embodiment, at least a portion of the substrate support 104 is partially surrounded by a trough (not shown) that is coupled to a fluid source 186, which may include water, ethylene glycol, nitrogen ($N_2$), helium (He), or combinations thereof, adapted as a heat exchange medium for the substrate support. The stator assembly 118 may also include a housing 190 to enclose various parts and components of the stator assembly 118. In one embodiment, the stator assembly 118 includes a drive coil assembly 168 stacked on a suspension coil assembly 170. The drive coil assembly 168 is adapted to rotate and/or raise/lower the substrate support 104 while the suspension coil assembly 170 may be adapted to passively center the substrate support 104 within the processing chamber 100. Alternatively, the rotational and centering functions may be performed by a stator having a single coil assembly.

An atmosphere control system 164 is also coupled to the interior volume 120 of the chamber body 102. The atmosphere control system 164 generally includes throttle valves and vacuum pumps for controlling chamber pressure. The atmosphere control system 164 may additionally include gas sources for providing process or other gases to the interior volume 120. The atmosphere control system 164 may also be adapted to deliver process gases for thermal deposition processes.

The chamber 101 includes a controller 124, which generally includes a central processing unit (CPU) 130, support circuits 128 and memory 126. The CPU 130 may be one of any form of computer processor that can be used in an industrial setting for controlling various actions and sub-processors. The memory 126, or computer-readable medium, may be one or more of readily available memory such as random access memory (RAM), read only memory (ROM), floppy disk, hard disk, or any other form of digital storage, local or remote, and is typically coupled to the CPU 130. The support circuits 128 are coupled to the CPU 130 for supporting the controller 124 in a conventional manner. These circuits include cache, power supplies, clock circuits, input/output circuitry, subsystems, and the like.

The actuator assemblies 122 generally comprise a precision lead screw 132 coupled between two flanges 134 extending from the walls 108 of the chamber body 102. The lead screw 132 has a nut 158 that axially travels along the lead screw 132 as the screw rotates. A coupling 136 is coupled between the stator 118 and nut 158 so that as the lead screw 132 is rotated, the coupling 136 is moved along the lead screw 132 to control the elevation of the stator 118 at the interface with the coupling 136. Thus, as the lead screw 132 of one of the actuators 122 is rotated to produce relative displacement between the nuts 158 of the other actuators 122, the horizontal plane of the stator 118 changes relative to a central axis of the chamber body 102. A motor 138, such as a stepper or servo motor, is coupled to the lead screw 132 to provide controllable rotation in response to a signal by the controller 124. Alternatively, other types of actuators 122 may be utilized to control the linear position of the stator 118, such as pneumatic cylinders, hydraulic cylinders, ball screws, solenoids, linear actuators and cam followers, among others.

The chamber 101 further includes one or more sensors 116, which are generally adapted to detect the elevation of the substrate support 104 (or substrate 140) within the interior volume 120 of the chamber body 102. The sensors 116 may be coupled to the chamber body 102 and/or other portions of the processing chamber 100 and are adapted to provide an output indicative of the distance between the substrate support 104 and the top 112 and/or bottom 110 of the chamber body 102, and may also detect misalignment of the substrate support 104 and/or substrate 140.

The one or more sensors 116 are coupled to the controller 124 that receives the output metric from the sensors 116 and provides a signal or signals to the one or more actuator assemblies 122 to raise or lower at least a portion of the substrate support 104. The controller 124 may utilize a positional metric obtained from the sensors 116 to adjust the elevation of the stator 118 at each actuator assembly 122 so that both the elevation and the planarity of the substrate support 104 and substrate 140 seated thereon may be adjusted relative to and a central axis of the process chamber 101 and/or the energy source 106. For example, the controller 124 may provide signals to raise the substrate support by action of one actuator 122 to correct axial misalignment of the substrate support 104, or the controller may provide a signal to all actuators 122 to facilitate simultaneous vertical movement of the substrate support 104.

The one or more sensors 116 may be ultrasonic, laser, inductive, capacitive, or other type of sensor capable of detecting the proximity of the substrate support 104 within the chamber body 102. The sensors 116, may be coupled to the chamber body 102 proximate the top 112 or coupled to the walls 108, although other locations within and around the chamber body 102 may be suitable, such as coupled to the stator 118 outside of the chamber 100. In one embodiment, one or more sensors 116 may be coupled to the stator 118 and are adapted to sense the elevation and/or position of the substrate support 104 (or substrate 140) through the walls 108. In this embodiment, the walls 108 may include a thinner cross-section to facilitate positional sensing through the walls 108.

The chamber 101 includes one or more temperature sensors 117, which may be adapted to sense temperature of the substrate 140 before, during, and after processing. The temperature sensors 117 are disposed through the top 112, although other locations within and around the chamber body 102 may be used. The temperature sensors 117 may be optical pyrometers, as an example, pyrometers having fiber optic probes. The sensors 117 may be adapted to couple to the top 112 in a configuration to sense the entire diameter of the substrate, or a portion of the substrate. The sensors 117 may comprise a pattern defining a sensing area substantially equal to the diameter of the substrate, or a sensing area substantially equal to the radius of the substrate. For example, a plurality of sensors 117 may be coupled to the top 112 in a radial or linear configuration to enable a sensing area across the radius or diameter of the substrate. In one embodiment (not shown), a plurality of sensors 117 may be disposed in a line extending radially from about the center of the top 112 to a peripheral portion of the top 112. In this manner, the radius of the substrate may be monitored by the sensors 117, which will enable sensing of the diameter of the substrate during rotation.

The chamber 101 further includes a cooling block 180 adjacent to, coupled to, or formed in the top 112. Generally, the cooling block 180 is spaced apart and opposing the energy source 106. The cooling block 180 comprises one or more coolant channels 184 coupled to an inlet 181A and an outlet 181B. The cooling block 180 may be made of a process resistant material, such as stainless steel, aluminum, a polymer, or a ceramic material. The coolant channels 184 may comprise a spiral pattern, a rectangular pattern, a circular pattern, or combinations thereof and the channels 184 may be formed integrally within the cooling block 180, for example by casting the cooling block 180 and/or fabricating the cooling block 180 from two or more pieces and joining the pieces. Additionally or alternatively, the coolant channels 184 may be drilled into the cooling block 180.

As described herein, the chamber 101 is adapted to receive a substrate in a "face-up" orientation, wherein the deposit receiving side or face of the substrate is oriented toward the cooling block 180 and the "backside" of the substrate is facing the energy source 106. The "face-up" orientation may allow the energy from the energy source 106 to be absorbed more rapidly by the substrate 140 as the backside of the substrate is typically less reflective than the face (i.e., frontside) of the substrate.

Although the cooling block 180 and energy source 106 is described as being positioned in an upper and lower portion of the interior volume 120, respectively, the position of the cooling block 180 and the energy source 106 may be reversed. For example, the cooling block 180 may be sized and configured to be positioned within the inside diameter of the substrate support 104, and the energy source 106 may be coupled to the top 112. In this arrangement, a window, made of a transparent material such as quartz or a polarizing material in accordance with embodiments discussed above, may be disposed between the energy source 106 and the substrate support 104, such as adjacent the energy source 106 in the upper portion of the chamber 101. Although the substrate 140 may absorb heat more readily when the backside is facing the energy source 106, the substrate 140 could be oriented in a face-up orientation or a face down orientation in either configuration.

The inlet 181A and outlet 181B may be coupled to a coolant source 182 by valves and suitable plumbing and the coolant source 182 is in communication with the controller 124 to facilitate control of pressure and/or flow of a fluid disposed therein. The fluid may be water, ethylene glycol, nitrogen ($N_2$), helium (He), or other fluid used as a heat exchange medium.

The chamber 101 may further include one or more gas inlets (not shown) for flowing a process gas. The one or more gas inlets may be configured to deliver the process gas across and/or perpendicular, or at any suitable angle to the substrate surface. The chamber 101 may further include an exhaust port (not shown) fluidly coupled to the interior volume 120 for removing the process gas from the interior volume 120 and/or for controlling pressure within the interior volume 120. The exhaust port may be coupled to a pump (not shown), such as a roughing pump, turbo pump, or the like. The process gas may be utilizing for thermal processing, for example, such as during the formation of an oxide on the substrate 140, or other suitable thermal processes, such as annealing. Exemplary process gases may include at least one of oxygen ($O_2$), nitrogen ($N_2$), hydrogen ($H_2$), helium (He), argon (Ar), or the like.

Figure 4:
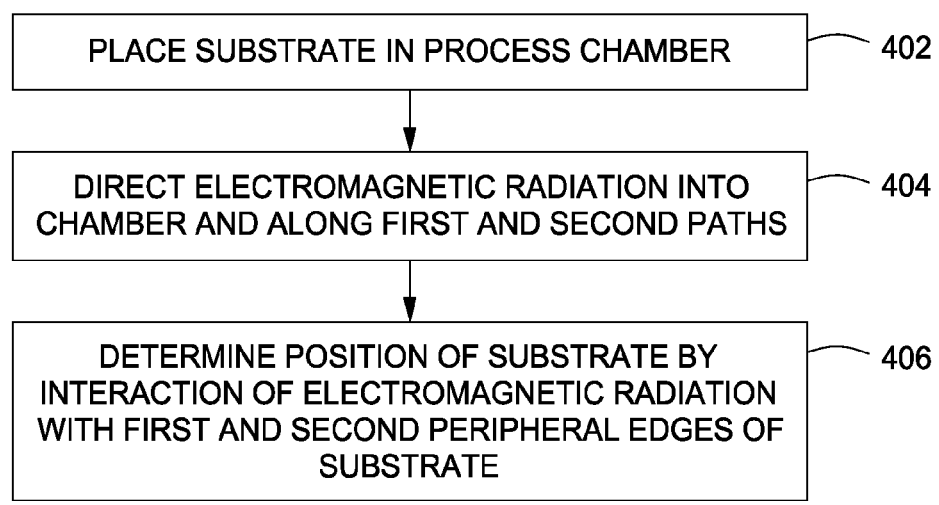
FIG. 4 depicts a flow chart of a method for determining the position of a substrate in accordance with some embodiments of the present invention.

FIG. 4 depicts a flow chart of a method 400 for determining the position of a substrate in a process chamber in accordance with some embodiments of the present invention. The method 400 is described below with respect to the process chamber 101 and the substrate positioning system 200 depicted in FIGS. 1 and 2A, respectively. However, the inventive methods can be utilized with the substrate positioning system 250, or any embodiment of a substrate positioning system as discussed above.

The method 400 begins at 402 by placing the substrate 140 in the interior volume 120 of the process chamber 101. The substrate 140 is placed atop the lift pins 144, where the lift pins 144 are in an extended configuration such that the substrate 140 rests above the support ring 109 of the substrate support 104. The substrate 140 may be any suitable substrate utilized in a semiconductor process, for example, such as thermal processing. The substrate 140 may have various dimensions, such as 200 or 300 mm diameter wafers, as well as rectangular or square panels. The substrate 140 may comprise a material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like.

At 404, electromagnetic radiation is directed into the interior volume 120 and along the first and second paths 210, 220. The electromagnetic radiation is provided by the first and second radiation sources 206, 208 in a first beam and a second beam, as discussed above. In some embodiments, the electromagnetic radiation may be pulsed at a desired pulse frequency. Referring to the first radiation 206, the first path 210, and the first sensor 216, a first amount of electromagnetic radiation is directed along the first path 210, wherein the first amount interacts with the first position 202 along the edge of the substrate 140. Dependent on the initial position of the substrate 140 on the lift pins 144, the first amount of radiation may be completely or partially blocked by the edge of the substrate proximate the first position 202. In embodiments where the first amount of radiation is completely blocked, the substrate 140 may be substantially misaligned and require re-positioning by a transfer robot or the like. In embodiments, where the first amount of radiation is partially blocked by the first position 202 along the edge, a first remaining amount of radiation continues along the first path 210. The first remaining amount of radiation may vary accordingly with a depth to which the edge of the substrate proximate the first position 202 penetrates the first path 210. The first remaining amount of radiation may be detected by the first sensor 216 disposed at the terminal end of the first path 210.

Referring to the second radiation source 208, the second path 220, and the second sensor 224, a second amount of electromagnetic radiation is directed along the second path 220, wherein the second amount interacts with the second position 204 along the edge of the substrate 140. Dependent on the initial position of the substrate 140 on the lift pins 144, the second amount of radiation may be completely or partially blocked by the edge of the substrate proximate the second position 204. In embodiments where the second amount of radiation is completely blocked, the substrate 140 may be substantially misaligned and require re-positioning by a transfer robot or the like. In embodiments, where the second amount of radiation is partially blocked by the edge of the substrate proximate the second position 204, a second remaining amount of radiation continues along the second path 220. The second remaining amount of radiation may vary accordingly with a depth to which the edge of the substrate proximate the second position 204 penetrates the second path 220. The second remaining amount of radiation may be detected by the second sensor 224 disposed at the terminal end of the second path 220.

The first and second remaining amounts of radiation may be detected serially or simultaneously by the substrate positioning system 200. For example, the first remaining amount of radiation may be detected by the first sensor 216, and then the second amount of radiation may be provided by the second radiation source 208 and blocked by the edge of the substrate proximate the second position 204. Accordingly, the substrate 140 may be re-positioned until the first remaining amount and the second remaining amount are both detected by the first sensor 216 and second sensor 224, respectively. Alternatively, the first remaining amount and second remaining amount of radiation can be detected simultaneously. In embodiments, where only one or neither are detected by the first and second sensors, the substrate 140 may be re-positioned until both the first and second remaining amounts are detected.

At 406, the position of the substrate 140 in two dimensions may be determined by the interaction of electromagnetic radiation with the first and second positions 202, 204 along the edge of the substrate 140. For example, the first and second sensors 216, 224 may detect all of the electromagnetic radiation emitted by the first and second radiation sources 206, 208, or the edge of the substrate may partially or completely block the electromagnetic radiation, causing the first and second sensors to detect only a portion of the electromagnetic radiation or no electromagnetic radiation provided by the first and second radiation sources 206, 208. In some embodiments where the electromagnetic radiation is pulsed at a known pulse frequency, the first and second sensors may be able to better detect the electromagnetic radiation.

The position of the substrate 140 is determined in two dimensions (e.g., in a horizontal plane of the interior volume 120). The position of the substrate 140 is determined by determining the position of the edge of the substrate 140 proximate the first and second positions 202, 204. For example, the position of the edge of the substrate proximate the first position 202 is determined by comparing the first amount of radiation provided by the first radiation source 206 with the first remaining amount of radiation detected by the first sensor 216 (e.g., no blockage, partial blockage, or complete blockage of the beam of radiation provided by the first radiation source). The difference between the first amount and first remaining amount may be utilized to determine the position of the edge of the substrate proximate the first position 202. Similarly, the difference between the second amount and second remaining amount of radiation may be utilized to determine the position of the edge of the substrate proximate the second position 204 (e.g., no blockage, partial blockage, or complete blockage of the beam of radiation provided by the second radiation source). By determining the position of the first and second positions 202, 204 along the edge of the substrate, the position of the substrate 140 can be determined in a horizontal plane of the interior volume 120.

Upon determining the position of the substrate 140, the method 400 may further include moving the substrate support 104 relative to the determined position of the substrate 140 to align the substrate support 104 with the substrate 104. Alignment may further include aligning a central axis of the support ring 109 with a central axis of the substrate 140. Upon alignment of the substrate 140 with the substrate support 104, the lift pins 144 may retract, lowering the substrate 140 into the seating surface 113 of the support ring 109.

Thus, methods and apparatus for aligning a substrate have been provided herein. Accurate determination of the substrate position in two dimensions advantageously facilitates improved alignment of the substrate atop a substrate support. Improved alignment is beneficial for achieving a desired heating profile during a thermal process.

While the foregoing is directed to embodiments of the present invention, other and further embodiments of the invention may be devised without departing from the basic scope thereof.

The invention claimed is:

1. An apparatus for processing a substrate, comprising:
   a process chamber having an interior volume for processing a substrate therein, the process chamber having a substrate support disposed within the interior volume of the process chamber with a plurality of lift pins to support the substrate above the substrate support; and
   a substrate positioning system configured to determine a substrate position within the interior volume when the substrate is held above the substrate support atop the lift pins, wherein the substrate positioning system determines the substrate position in two dimensions by the interaction of a first position and a second position along an edge of a substrate with a first beam and a second beam of electromagnetic radiation provided to the interior volume of the process chamber by the substrate positioning system while the substrate is held above the substrate support atop the lift pins.

2. The apparatus of claim 1, wherein the substrate positioning system further comprises:
   a first radiation source configured to provide the first beam of electromagnetic radiation along a first path, wherein the first path is configured to partially intersect the edge of the substrate proximate the first position; and
   a second radiation source configured to provide the second beam of electromagnetic radiation along a second path, wherein the second path is configured to partially intersect the edge of the substrate proximate the second position.

3. The apparatus of claim 2, wherein the substrate positioning system further comprises:
   a first sensor configured to detect electromagnetic radiation provided by the first radiation source; and
   a second sensor configured to detect electromagnetic radiation provided by the second radiation source.

4. The apparatus of claim 3, wherein the first and second sensors and first and second radiation sources are disposed external to the interior volume.

5. The apparatus of claim 4, wherein the first sensor is disposed at a terminal end of the first path and wherein the second sensor is disposed at a terminal end of the second path.

6. The apparatus of claim 4, wherein the first path is disposed at a first angle to the substrate surface and wherein the second path is disposed at a second angle to the substrate surface.

7. The apparatus of claim 6, wherein the first and second angles are between about −5 degrees to about 5 degrees.

8. The apparatus of claim 4, the substrate positioning system further comprising:
   a first reflector disposed at a terminal end of the first path and configured to reflect electromagnetic radiation to the first sensor; and
   a second reflector disposed at a terminal end of the second path and configured to reflect electromagnetic radiation to the second sensor.

9. The apparatus of claim 8, wherein the first and second reflectors comprise polished stainless steel or quartz.

10. The apparatus of claim 4, wherein the process chamber is configured to perform a rapid thermal process.

11. The apparatus of claim 1, wherein the substrate support is configured for movement in a horizontal direction relative to the position of a substrate determined by the substrate positioning system.

12. The apparatus of claim 4, wherein a width of the beam of electromagnetic radiation along each of the first and second paths is about 10 mm.

13. A method for determining the position of a substrate, comprising:
   placing a substrate atop a plurality of lift pins to support the substrate above a substrate support disposed in an interior volume of a process chamber;
   directing electromagnetic radiation into the interior volume in a first beam along a first path and in a second beam along a second path; and
   determining the position of the substrate atop the plurality of lift pins in two dimensions by interaction of the first and second beams of electromagnetic radiation with an edge of the substrate proximate a first position and a second position.

14. The method of claim 13, wherein directing electromagnetic radiation further comprises:
   directing a first amount of electromagnetic radiation along the first path, wherein the first amount interacts with the edge of the substrate proximate the first position; and
   directing a second amount of electromagnetic radiation along the second path, wherein the second amount interacts with the edge of the substrate proximate the second position.

15. The method of claim 14, further comprising:
   detecting a first remaining amount of electromagnetic radiation, wherein the first remaining amount results from the interaction of the first amount of electromagnetic radiation with the edge of the substrate proximate the first position; and
   detecting a second remaining amount of electromagnetic radiation, wherein the second remaining amount results from the interaction of the second amount of electromagnetic radiation with the edge of the substrate proximate the second position.

16. The method of claim 15, wherein determining the position of the substrate further comprises:
   determining the substrate position along a first direction by comparing the first amount to the first remaining amount of electromagnetic radiation; and
   determining the substrate position along a second direction by comparing the second amount to the second remaining amount of electromagnetic radiation.

17. The method of claim 16, wherein the first path is disposed at a first angle to the substrate surface and wherein the second path is disposed at a second angle to the substrate surface.

18. The method of claim 17, wherein the first and second angles are between about −5 degrees to about 5 degrees.

19. The method of claim 16, further comprising:
   laterally moving a substrate support relative to the determined position of the substrate to align the substrate support with the substrate.

20. The method of claim 19, wherein aligning the substrate support with the substrate further comprises:
   aligning a central axis of an edge ring of the substrate support with a central axis of the substrate.

* * * * *